United States Patent
Sanekata

(10) Patent No.: US 7,726,803 B2
(45) Date of Patent: Jun. 1, 2010

(54) DROPLET EJECTION APPARATUS

(75) Inventor: Takahito Sanekata, Suwa (JP)

(73) Assignee: Seiko Epson Corporation (JP)

( * ) Notice: Subject to any disclaimer, the term of this patent is extended or adjusted under 35 U.S.C. 154(b) by 808 days.

(21) Appl. No.: 11/421,545

(22) Filed: Jun. 1, 2006

(65) Prior Publication Data

US 2007/0002114 A1    Jan. 4, 2007

(30) Foreign Application Priority Data

Jun. 29, 2005    (JP)    ............... 2005-189508

(51) Int. Cl.
   *B41J 2/01*    (2006.01)
(52) U.S. Cl. ...................... 347/102; 347/101
(58) Field of Classification Search .............. 347/102, 347/101, 103, 14, 15, 5
   See application file for complete search history.

(56) References Cited

U.S. PATENT DOCUMENTS

| | | | |
|---|---|---|---|
| 5,059,266 A * | 10/1991 | Yamane et al. .............. | 156/64 |
| 5,132,248 A | 7/1992 | Drummond et al. | |
| 6,910,764 B2 | 6/2005 | Nakajima | |
| 6,952,311 B2 * | 10/2005 | Sakai ..................... | 359/619 |
| 7,217,438 B2 | 5/2007 | Newsome et al. | |

| | | | |
|---|---|---|---|
| 2004/0226929 A1 * | 11/2004 | Miura et al. ............ | 219/121.85 |

FOREIGN PATENT DOCUMENTS

| | | |
|---|---|---|
| EP | 1223615 | 7/2002 |
| JP | 2003-318193 A | 11/2003 |
| JP | 2003-326691 | 11/2003 |
| JP | 2004-241770 | 8/2004 |
| JP | 2004-337709 | 12/2004 |
| JP | 2005-502455 | 1/2005 |
| JP | 2005-040665 A | 2/2005 |
| JP | 2005-081159 | 3/2005 |
| JP | 2005-105414 A | 4/2005 |
| JP | 2006-035184 | 2/2006 |
| JP | 2005-095849 | 4/2006 |
| JP | 2006-100381 | 4/2006 |

* cited by examiner

*Primary Examiner*—Manish S Shah
(74) *Attorney, Agent, or Firm*—Harness, Dickey & Pierce, P.L.C.

(57) ABSTRACT

A droplet ejection apparatus includes: a base; a plotting system having a droplet ejection head that ejects functional liquid as a droplet, a carriage that holds the droplet ejection head, and a stage that holds a work at which the droplet is plotted; and an optical system having a light source that outputs a laser beam and an optical path, which is constituted between the light source and the droplet and through which the laser beam passes to irradiate the droplet; wherein: the plotting system and the optical system are established on the base sharing the upper surface of the base as a reference surface, and pattern is plotted and fixed through cooperation control of both systems.

18 Claims, 6 Drawing Sheets

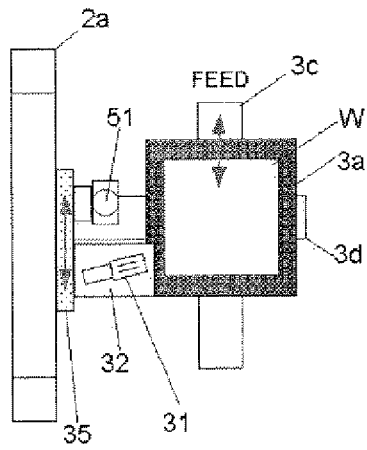
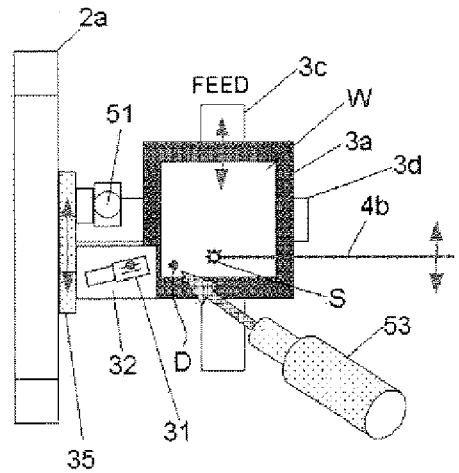
FIG. 9A                FIG. 9B
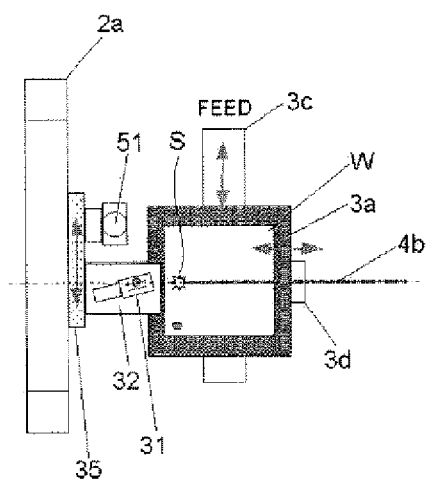
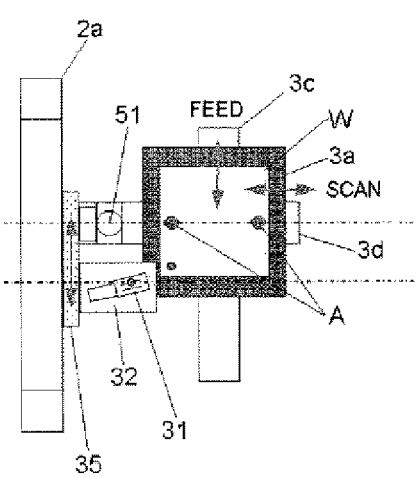
FIG. 10A               FIG. 10B

DROPLET EJECTION APPARATUS

BACKGROUND

1. Technical Field

The present invention relates to a droplet ejection apparatus, particularly to a droplet ejection apparatus having a plotting system that ejects droplets and an optical system that irradiates the ejected droplets with laser beams, and more particularly to a droplet ejection apparatus that forms wiring patterns.

2. Related Art

When patterning metal wiring using a droplet ejection technique, it needs to reduce process time, cost, and energy in the drying and baking process. At present, the drying and baking is conducted using a hot plate or a clean oven. However, because it takes long time for the process, there are the cost and energy problems. Thus, a process is proposed by which a metal wiring pattern is formed by discharging droplets, and, thereafter, the drying and baking is conducted using laser.

JP-A-2004-241770 proposes an inkjet device, with which a conductive material is discharged on a work on a substrate to plot a conductive layer, and the plotted conductive layer is heat-treated with a lamp or laser light. With this device, an inkjet process chamber that discharges the conductive material is provided separately from an irradiation chamber that emits the lamp or laser light. The work is subjected to the plotting process in the inkjet process chamber, then transported to the irradiation chamber to be irradiated with the laser light or the like.

In the device shown in JP-A-2004-241770, it is difficult to accurately control parameters concerning droplet discharge and laser irradiation, such as the time needed between the landing of the droplet on the work and the laser irradiation because the plotting system that discharges the conductive material and the optical system that irradiates the discharged conductive material with the lamp or laser light are provided separately from each other. Further, because the device of JP-A-2004-241770 has the plotting system and the optical system on different reference surfaces, it takes time and effort to align the plotted conductive layer with the laser light irradiation spot. Moreover, because the work is transported from the inkjet process chamber to the laser irradiation chamber, it requires time for the transportation.

SUMMARY

An advantage of the invention is to provide a droplet ejection apparatus that enables easy control of parameters concerning droplet ejection and laser irradiation and that enables accurate and speedy alignment of the ejected droplet with the laser spot.

According to the present invention, a droplet ejection apparatus includes: a base; a plotting system having a droplet ejection head that ejects functional liquid as a droplet, a carriage that holds the droplet ejection head, and a stage that holds a work at which the droplet is plotted; and an optical system having a light source that outputs a laser beam and an optical path, which is constituted between the light source and the droplet and through which the laser beam passes to irradiate the droplet; wherein: the plotting system and the optical system are established on the base sharing the upper surface of the base as a reference surface, and pattern is plotted and fixed through cooperation control of both systems.

With the droplet ejection apparatus, it is preferable that the optical path includes a first optical path through which the laser beam is irradiated on the droplet from an upper direction against the stage.

With the droplet ejection apparatus, it is preferable that the optical path includes a second optical path through which the laser beam is irradiated on the droplet diagonally against the stage.

With the droplet ejection apparatus, it is preferable that the optical path includes a second optical path through which the laser beam is irradiated on the droplet horizontally against the stage.

It is preferable that the droplet ejection apparatus further includes a protection cover that protects the droplet ejection head from the laser beam, the side surface of the protection cover being usable as a plane surface for verification of a laser spot position when adjusting the path of the third optical path.

With the droplet ejection apparatus, the first optical path may be used to irradiate the laser beam on the droplet landed on the work. The second optical path may be used to irradiate the laser beam on the droplet in flight or the droplet landed on the work. The third optical path may be used to irradiate the laser beam on the droplet immediately after the ejection, on the droplet in flight, or on the droplet landed on the work. Additionally, these optical paths may be constituted of a plurality of lenses arranged at predetermined positions on the base.

It is preferable that the droplet ejection apparatus further includes, on the base, a first electronic camera used to align the work with the plotting system and a second electronic camera used to align the plotting system with the optical system.

With the droplet ejection apparatus, it is preferable that the positions of the carriage and the droplet ejection head are fixed against the base, and the stage moves so as to carry out the plotting.

With the droplet ejection apparatus, it is preferable that an area irradiated by the laser that has passed through the optical path is positioned along a moving direction of the work, in front of an area of the work on which the droplet lands.

With the droplet ejection apparatus, it is preferable that the functional liquid includes a material of an electric, optical, or electrooptical element, and that a device is manufactured by plotting a predetermined pattern by ejecting the droplet on the work and by irradiating the droplet with the laser beam to fix the pattern.

With the droplet ejection apparatus, it is preferable that the functional liquid includes conductive particles, and that a wiring pattern is formed by plotting a predetermined pattern by ejecting the droplet on the work and by irradiating the droplet with the laser beam to dry the droplet and sinter the conductive particles.

For the functional liquid, one that includes metal microparticles dispersed in a solvent may be suitably used. In this embodiment, the laser beam may be irradiated on the droplet not only to dry the droplet but also, for example, to form the wiring and to sinter the metal microparticles. Further, an electrooptical device means a device containing elements having electric, optical, or electrooptical functions, such as, for example, a semiconductor device, a wiring substrate, or a display device such as an organic electroluminescence (EL), liquid crystal, electroluminescence, or electrophoretic display device.

The liquid ejection device of the invention may be used for pattern formation of electric wiring, metal wiring, organic EL elements, color filters, photoresist, microlens arrays, electroluminescence, functional elements of organic substances or the like. The functional liquid to be used may include, for example, pattern-forming constituents and a solvent suitable for the constituents.

According to the invention, because the plotting system and the optical system are arranged on the same reference base, the positioning of the plotting system with the optical system may be readily established by the cooperation control of both systems. Consequently, the laser beam may be accurately irradiated on the ejected droplet, and the parameters concerning the droplet ejection and laser irradiation may be readily controlled.

Further, according to the invention, because the laser beam may be accurately irradiated on the droplet, the droplets may be irradiated with the laser beam at such precise timings as immediately after the droplet is ejected from the droplet ejection head, immediately after the droplet lands on the work, and when the droplet is in flight, so that the droplet may be dried and that the droplet diameter and the diameter of the landed droplet may be made small.

BRIEF DESCRIPTION OF THE DRAWINGS

The invention will be described with reference to the accompanying drawings, wherein like numbers reference like elements.

FIGS. 9A and 9B are diagrams to explain an alignment mark formation process and particularly to explain a process of aligning a laser spot with a droplet ejection head in the droplet ejection apparatus shown in FIG. 2.

FIG. 10A is a diagram to explain the alignment mark formation process and particularly to explain a process of forming the alignment mark on a work.

FIG. 10B is a diagram to explain the alignment mark formation process and particularly to explain a process of verifying the alignment mark using a CCD camera.

DESCRIPTION OF EXEMPLARY EMBODIMENT

Figure 1:
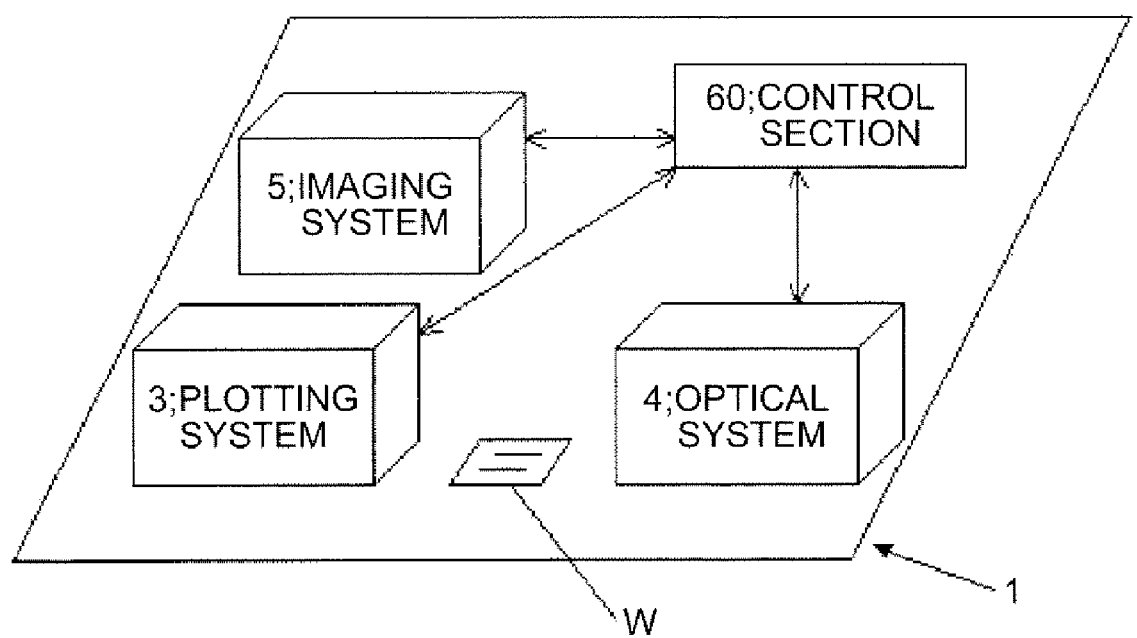
FIG. 1 is a schematic block diagram to explain the control structure of a droplet ejection apparatus according to one working example of the invention.

In an exemplary embodiment of the invention, the base is a vibration-proof base, and the plotting system and the optical system are established on the upper surface of the vibration-proof base as the reference surface. The plotting system and the optical system can be mounted on the base by such well-known anchoring means as bolts and nuts, chucks, welding, and bonding.

One working example of the invention will now be described referring to the drawings.

FIG. 1 is a schematic block diagram to explain the control structure of a droplet ejection apparatus according to one working example of the invention.

FIG. 1 illustrates the basic control structure of the droplet ejection apparatus according to one working example of the invention, which includes: on a base 1 whose upper surface being shared as the reference surface, a plotting system 3 that contains a droplet ejection head 31 and the like (see FIG. 2); an optical system 4 that contains first to third optical paths and the like (see FIG. 2) and irradiates laser on ejected droplets or droplets landed on a work (a pattern); a control section 60, which carries out general control of droplet ejection, timing of laser irradiation, positions of droplet ejection, and positions of laser irradiation, and which carries out pattern plotting and pattern fixation through cooperation control of both systems (the plotting system 3 and the optical system 4); and an imaging system 5, which is controlled by the control section 60 and which establishes alignment of the plotting system 3 with the optical system 4 and alignment of the plotting system 3 with a work W on which the droplets land and the patterns are plotted and fixed. The control section 60 can be composed of microcomputers, which receive sensor signals, image signals, and the like from the plotting, optical, and imaging systems 3, 4, and 5, and output various types of drive control signals, cooperatively controlling these systems.

Figure 2:
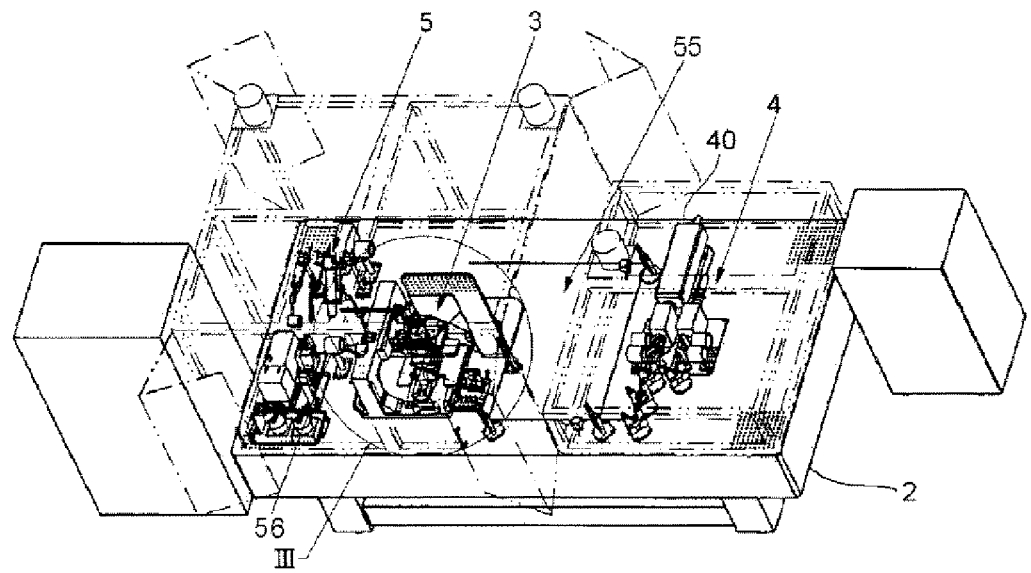
FIG. 2 is a diagram to explain the external structure of the droplet ejection apparatus according to one working example of the invention.
Figure 3:
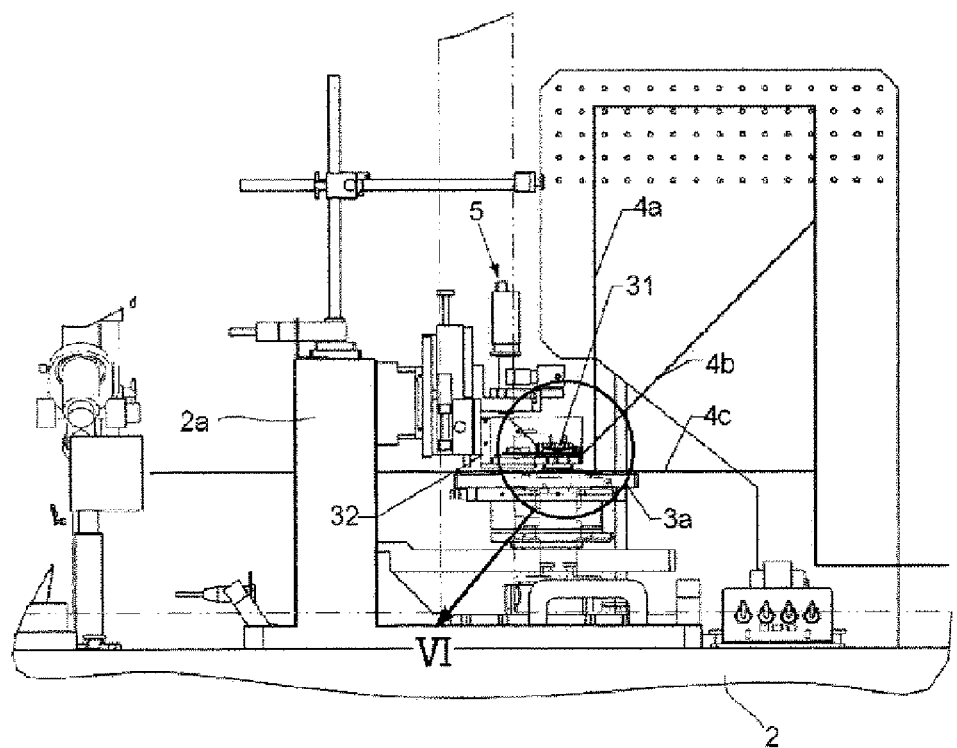
FIG. 3 is an elevation view of the essential part of FIG. 2.

FIG. 2 is a diagram to explain the external structure of the droplet ejection apparatus according to one working example of the invention. FIG. 3 is an elevation view of the essential part of FIG. 2. As shown in FIGS. 2 and 3, a droplet ejection apparatus 1 according to one working example of the invention includes a base 2, the plotting system 3, the optical system 4, and the imaging system 5.

The base 2 is the vibration-proof base. On the base 2, the plotting system 3, the optical system 4, and the imaging system 5 are established sharing the upper surface of the base 2 as the reference surface. On the base 2, an experiment area including the plotting system 3 is arranged on the left side of the base 2 in FIG. 2; a laser box area including the optical system 4 is arranged on the right side of the base 2; the experiment area and the laser box area are divided by a partition 55; and the imaging system 5 used for the alignment is arranged next to the plotting system 3.

The plotting system 3 is equipped with the droplet ejection head 31 that ejects the functional liquid as droplets D, a carriage 32 that holds the droplet ejection head 31, and a stage 3a that holds the work W on which the droplets are plotted. The droplet ejection head 31 is protected by a protection cover (not shown) from the laser beam output from the optical system 4. The side surface of the protection cover can be used as a plane surface for verifying the position of a laser spot when adjusting the optical path of a parallel-type third optical path 4c which will be described hereafter.

During the plotting (during the pattern formation by successive droplet ejection), a mechanism including the droplet ejection head 31 and the optical system 4 are fixed, and a mechanism including the stage 3a is moved in a scan-axis direction. A laser spot area, to which the optical system 4 outputs the laser, is located at the front of the moving direction of the stage 3a.

The optical system 4, which is established using the upper surface of the base (vibration-proof base) 2 as the reference surface, can form the laser path with high precision. This is because the laser spot position is stabilized as it is uninfluenced by a driving means, compared to when the optical system 4 is established on a moving member such as the carriage 32. The optical system 4 is equipped with a light source S that outputs the laser beam and with the first to third optical paths 4a, 4b, and 4c, which are constituted between the light source S and the droplets D and through which the laser beams pass and irradiate the droplets D. The first to third light paths 4a, 4b, and 4c are chosen in a given manner, and via these paths, the laser is irradiated on the droplets ejected from the droplet ejection head 31 after the irradiation positions and angles are adjusted.

The first optical path 4a takes a path high above the droplet ejection head 31 and enables the laser beam to enter at an angle of 90 degrees (90° is the reference angle; the angle is adjustable) against the stage 3a so as to irradiate the droplet.

The second optical path 4b enables the laser beam to enter at an angle of 45 degrees (45° is the reference angle; the angle is adjustable) against the stage 3a so as to irradiate the droplet. The laser spot made by the second optical path 4b has an oval shape, and the distribution state of the laser strength also changes.

The third optical path 4c enables the laser beam to enter between the droplet ejection head 31 and the stage 3a and to be incident against and in parallel to the stage 3a, and can be used to irradiate the droplet immediately after the ejection or the droplet in flight. The laser beam via the third optical path 4c is received by a beam diffuser 56. By use of the third optical path 4c, a drying process is carried out as the droplet passes through the laser path during flight. As a result, the diameter of the droplet upon landing on the work becomes smaller than when this process is not applied. By applying this process, the metal wiring can be made finer.

The first to third optical paths 4a, 4b, and 4c can be formed on the base 2, using such optical elements as reflection mirrors, lenses, gratings, and the like arranged at predetermined positions. For safety reasons, it is preferable that the laser beam enters via a shutter into the experiment area where the plotting system 3 is positioned. Further, it is preferable to adjust the optical path, verify the laser beam strength for the drying and baking, and provide an interlock. The laser spot diameter can be altered by adjusting the optical elements. The shape can also be altered, and the spot position can be adjusted in a scan-axis direction (a horizontal direction in FIG. 3). The spot position can also be adjusted in a feed-axis direction (an anteroposterior direction in FIG. 3).

Figure 4:
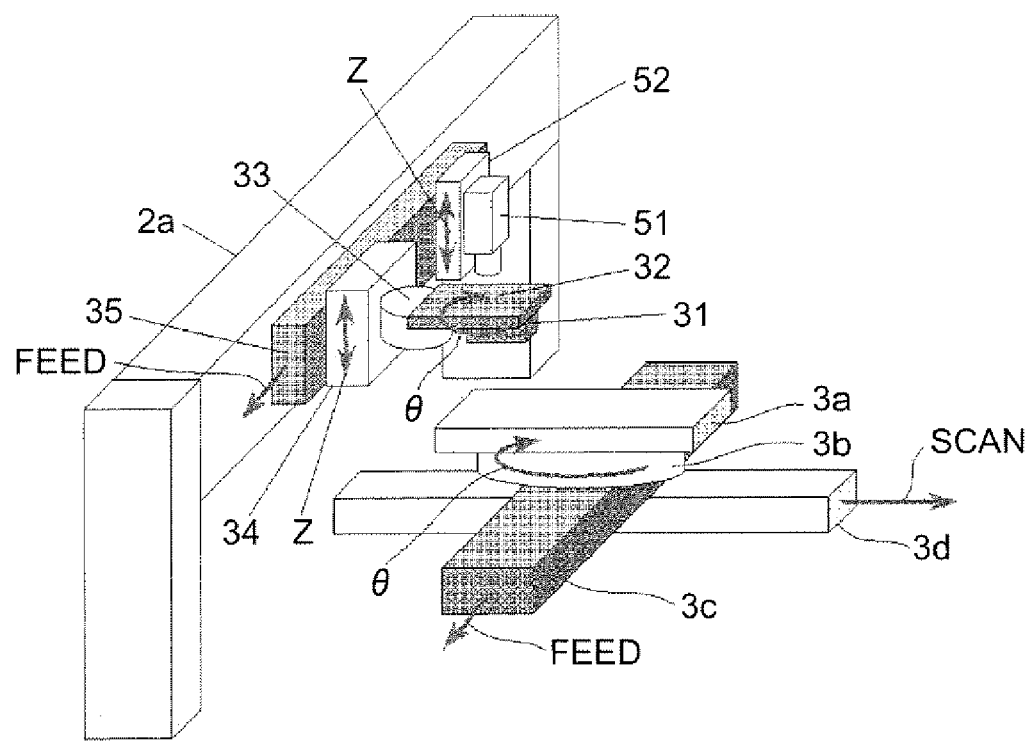
FIG. 4 is a pattern diagram to explain a plotting system and an imaging system shown in FIG. 2.
Figure 5:
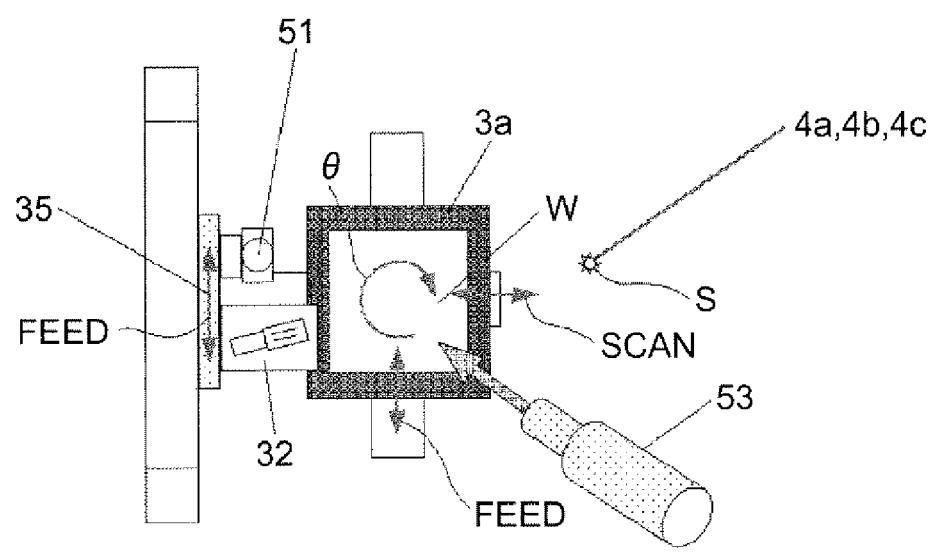
FIG. 5 is a pattern diagram to explain the plotting system and an optical system shown in FIG. 2.

FIG. 4 is a pattern view to explain the plotting system and the imaging system shown in FIG. 2. FIG. 5 is a pattern diagram to explain the plotting system and the optical system shown in FIG. 2.

FIGS. 4 and 5 illustrate that the plotting system 3 shown in FIG. 2 is composed of the mechanism including the droplet ejection head 31 and the mechanism including the stage 3a holding the work W.

The mechanism including the droplet ejection head 31 is equipped with: the droplet ejection head 31; the carriage 32; a gonio-stage 33 for the carriage, which is a θ-direction rotating rotor; a Z-axis direction moving body 34 for the carriage, which is manually operated before and after the plotting; and a feed-direction moving body 35 for the carriage, on which the moving body 34 is mounted to move freely in the Z-axis direction. The moving body 35 is mounted on a bridge 2a to move freely in the feed direction, and the bridge 2a is fixed on the base 2 shown in FIG. 2. The moving body 34 is operated manually before and after the plotting. The gonio-stage 33 is a stage having an assumed rotational center at the front of the mounting surface against the moving body 34, and its rotation (0°-90°) is readily adjusted when used in combination with various types of head-mounting plates.

In addition, because the droplet ejection head 31 is arranged projecting outwardly in the radial direction of the gonio-stage 33 via the carriage 32, it is possible to prevent the laser from interfering with the device-occupying area when arranging the optical path of the laser as closely to the droplet ejection head 31 as possible.

The mechanism including the stage 3a is composed of, as illustrated from the bottom, a feed-axis moving mechanism, a scan-axis moving mechanism, and a θ-axis moving mechanism. More specifically, the mechanism including the stage 3a is equipped with: the stage 3a; a θ-direction rotor 3b for the stage; a feed-direction moving body 3c for the stage, on which the rotor 3b is mounted to move freely in the θ direction; and a scan-direction moving body 3d for the stage, on which the moving body 3c is mounted to move freely in the scan direction. The moving body 3d is mounted on the base 2 shown in FIG. 2, moving freely in the scan direction. As thus shown, by making the mechanism including the stage 3a to be able to move in the feed- and scan-axis directions, the mechanism including the droplet ejection head 31 can be fixed during the plotting. As a result, the position of a supply passage of the functional liquid does not move during the plotting, and the functional liquid can be stably supplied to the droplet ejection head 31.

The imaging system 5 shown in FIG. 2 is equipped with: a first CCD camera 51 for the alignment of the work W with the plotting system 3, that is, for the alignment of the droplet landing position and the work; a Z-axis direction moving body 52 for the first CCD camera, on which the first CCD camera 51 is mounted to move freely in the Z-axis direction; and a second CCD camera 53 for the alignment of the plotting system 3 with the optical system 4, that is, for the alignment of the droplet landing position with the laser spot S of the laser beam irradiated on the work W via the first to third optical paths 4a, 4b, and 4c. The moving body 52 is mounted on the feed-direction moving body 35 for the carriage to move freely in the Z-axis direction.

In addition, the above-described rotors and moving bodies are suitably driven by motors, direct-acting mechanisms, worm-and-rack mechanisms, and the like that are not shown in the drawings.

Now, various methods of wiring pattern formation by the above-described droplet ejection apparatus will be described.

FIGS. 6A through 6D are process diagrams to explain a wiring pattern formation method using the first optical path in the droplet ejection apparatus shown in FIG. 2. According to this formation method, the functional liquid having the metal microparticles dispersed in a solvent is ejected as droplets from the droplet ejection head 31, and the laser beam is emitted vertically to the surface of the work W via the first optical path 4a.

Figure 6A:
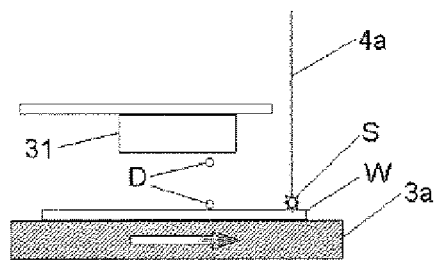
FIGS. 6A through 6D are process diagrams to explain a wiring pattern formation method using a first optical path in the droplet ejection apparatus shown in FIG. 2.

In FIG. 6A, the droplets D are ejected from the droplet ejection head 31 towards the work W on the stage 3a in the vertical direction and land on the work W.

Figure 6B:
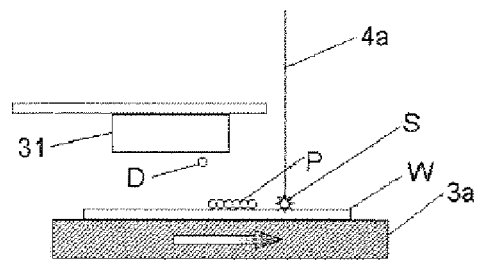

In FIG. 6B, as the stage 3a moves in the scan direction, the droplets D land successively on the work W to form a pattern P that is not yet dried nor baked.

Figure 6C:
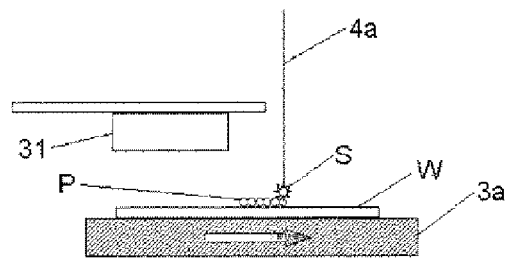

In FIG. 6C, as the stage 3a further moves in the scan direction, one end of the pattern P is positioned directly below the first optical path 4a, that is, the laser spot S, so as to be irradiated with the laser beam.

Figure 6D:
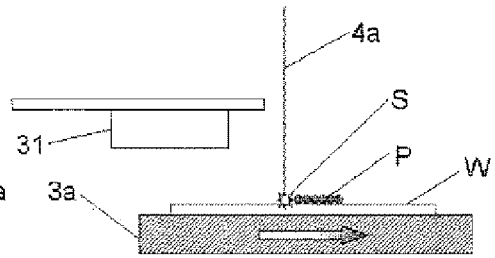

In FIG. 6D, as the stage 3a further moves in the scan direction, the laser beam is irradiated from the one end through to the other end of the pattern P. Consequently, the solvent is evaporated, the metal microparticles are sintered to each other, and the pattern P is thereby completed.

Figure 7A:
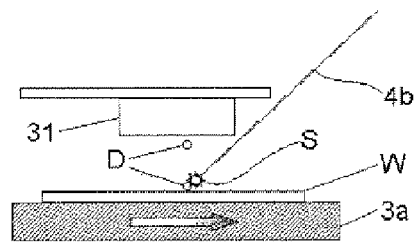
FIGS. 7A and 7B are process diagrams to explain the wiring pattern formation method using a second optical path in the droplet ejection apparatus shown in FIG. 2.
Figure 7B:
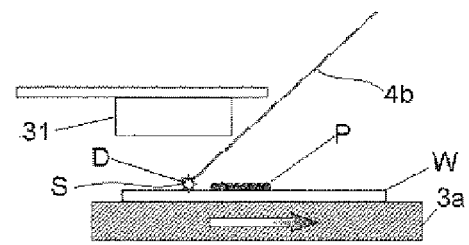

FIGS. 7A and 7B are process diagrams to explain the wiring pattern formation method using the second optical path in the droplet ejection apparatus shown in FIG. 2. According to this formation method, the functional liquid having metal microparticles dispersed in a solvent is ejected as droplets from the droplet ejection head 31, and the laser beam is emitted diagonally to the surface of the work W via the second optical path 4b.

In FIG. 7A, the droplet D is ejected from the droplet ejection head 31 towards the work W on the stage 3a and lands at the laser spot S on the work W. Simultaneously, as the laser beam is irradiated on the droplet D via the second optical path 4b, the solvent in the droplet D is evaporated and dried, and the metal microparticles are sintered to each other.

In FIG. 7B, as the stage 3a moves in the scan direction, the droplets D land successively at the laser spot S on the work W. Simultaneously, as the laser beam is irradiated on the droplets D via the second optical path 4b, the solvent in the droplets D is evaporated and dried, and the metal microparticles are sintered to each other to form the pattern P.

Figure 8A:
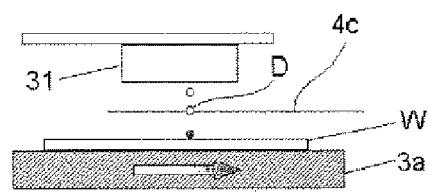
FIGS. 8A and 8B are process diagrams to explain the wiring pattern formation method using a third optical path in the droplet ejection apparatus shown in FIG. 2.
Figure 8B:
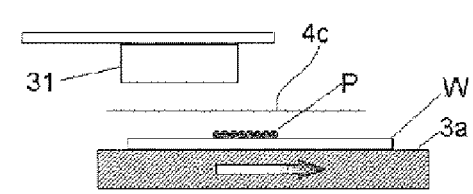

FIGS. 8A and 8B are process diagrams to explain the wiring pattern formation method using the third optical path in the droplet ejection apparatus shown in FIG. 2.

In FIG. 8A, the laser beam is irradiated via the third optical path 4c between the droplet ejection head 31 and the work W. The droplet ejection head 31 ejects the droplet D in a manner that the droplet D crosses the laser beam. By being irradiated with the laser beam while flying, the droplet D lands on the work W in a state that the droplet diameter has shrunk upon evaporation of the solvent.

In FIG. 8B, as the stage 3a moves in the scan direction, the droplets D land successively on the work W to form the pattern P. By this method, since the solvent in the functional liquid evaporates in the air, the pattern can be formed more finely.

Now, the alignment process of the laser spot with the droplet ejection head in the droplet ejection apparatus shown in FIG. 2 will be described.

FIGS. 9A and 9B are diagrams to explain the alignment process of the laser spot with the droplet ejection head in the droplet ejection apparatus shown in FIG. 2.

In FIG. 9A, a glass substrate (plain glass) as the work W is set on the stage 3a by vacuum suction. By moving the stage 3a in the feed-axis direction, the alignment mark formation position is matched with the position of the carriage 32.

Several droplets are ejected from the droplet ejection head 31. After the droplets D have landed on the work W, the stage 3a is moved in the scan-axis direction (at this point, the amount of movement is checked); the landed droplets are taken out from directly below the carriage 32; and the landed droplets D and the laser spot S are together placed within the visual field of the second CCD camera for the verification of the laser spot S. In this situation, the laser optical paths such as the second optical path 4b are adjusted, for example, so as to align the landing position of the droplets D with the laser spot S. By changing zoom magnification of the second CCD camera 53, rough adjustment and then fine adjustment are conducted. By these processes, the alignment of the droplet ejection head 31 with the laser spot S is completed, and the metal wiring formed by the ejection from a predetermined nozzle of the droplet ejection head 31 can be irradiated with the laser beam. Further, by varying the control methods the laser beam, a variety of irradiation patterns can be realized.

Next, the alignment process of the work (the substrate) will be described.

FIGS. 10A and 10B are diagrams to explain the alignment process of the work (the substrate) in the droplet ejection apparatus shown in FIG. 2.

To form the alignment mark, several droplets are ejected from the droplet ejection head 31. The laser beam is also simultaneously irradiated. After the droplets D landed on the work W, the stage 3a is moved in the scan-axis direction, and the landed droplets D are positioned at the laser spot S. The droplets D irradiated with laser are dried and baked. By repeating this process, an alignment mark A is formed in two places in the scan direction of the work W. If necessary, the position, quantity, and shape of the alignment mark A can be changed.

The stage 3a is moved in the feed-axis direction so as to bring the formed alignment mark A within the visual field of the first CCD camera 51. By moving the stage 3a in the scan-axis direction, the CCD camera 51 verifies the shape of the alignment marks A's in two places and registers the shape of the marks. After the mark registration, common substrate alignment can be carried out. For example, after the metal wiring is dried and baked using the first to third laser optical paths 4a, 4b, and 4c, and then the work W is taken out from the stage 3a to carry out other operations at some other place, it is possible to immediately carry out the alignment of the work W even if additional operations need to be done using this droplet ejection apparatus.

Experimental results using the droplet ejection apparatus shown in FIG. 2 will now be explained.

Figures 11A, 11B:
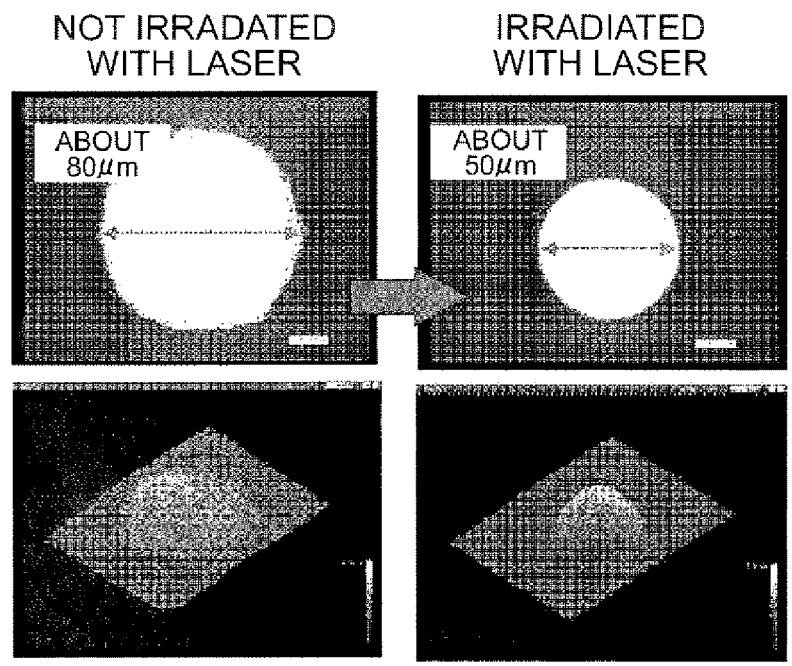
FIG. 11A is a diagram to explain an experimental result using the droplet ejection apparatus shown in FIG. 2, showing the result of a comparative example not using laser irradiation.
FIG. 11B is a diagram to explain an experimental result using the droplet ejection apparatus shown in FIG. 2, showing the result of the working example using the laser irradiation.

FIGS. 11A and 11B are diagrams to explain experimental results using the droplet ejection apparatus shown in FIG. 2. FIG. 11A is a diagram to explain the result of a comparative example not using the laser irradiation, and FIG. 11B is a diagram to explain the result of the working example using the laser irradiation.

Comparison of FIGS. 11A and 11B indicates that wettability of the droplets after the landing is suppressed because of the laser irradiation.

Figures 12A, 12B:
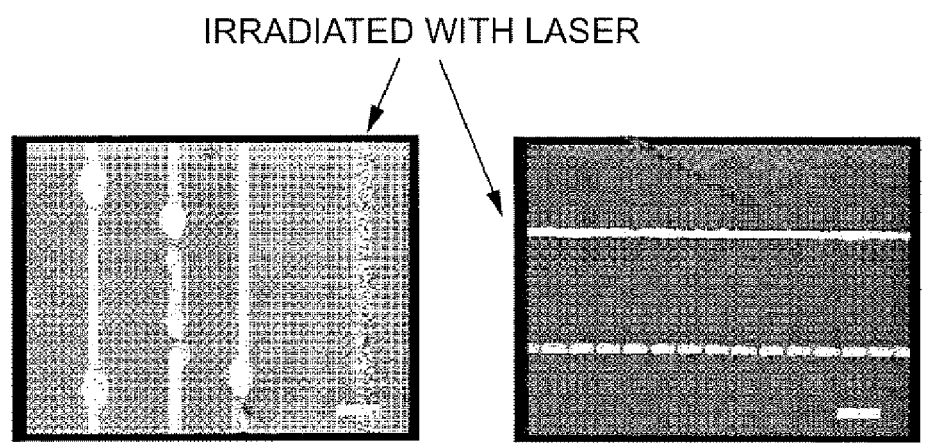
FIG. 12A is a diagram to explain experimental results using the droplet ejection apparatus shown in FIG. 2, showing examples of metal wiring pattern formation when a large amount of liquid is ejected: the pattern at far right is the working example using the laser irradiation, and the other patterns are comparative examples not using the laser irradiation.
FIG. 12B is a diagram to explain experimental results using the droplet ejection apparatus shown in FIG. 2, showing examples of the metal wiring pattern formation when a small amount of liquid is ejected: the upper pattern is the working example using the laser irradiation, and the lower pattern is a comparative example not using the laser irradiation.

FIGS. 12A and 12B are diagrams to explain experimental results using the droplet ejection apparatus shown in FIG. 2. FIG. 12A shows examples of the metal wiring pattern formation when a large amount of liquid is ejected, in which the pattern at far right is the working example using the laser irradiation, and the other patterns are the comparative examples not using the laser irradiation. FIG. 12B shows examples of the metal wiring pattern formation when a small amount of liquid is ejected, in which the upper pattern is the working example using the laser irradiation, and the lower pattern is the comparative example not using the laser irradiation.

FIGS. 12A and 12B indicate that occurrence of bulging and breaking is suppressed because of the laser irradiation.

The invention is applied to the patterning not only of the metal wiring but of color filters, thermosetting resin or ultraviolet curing resin used for three-dimensional shaping, electroluminescence elements, microlens arrays, and biological substances such as DNA and protein.

The entire disclosure of Japanese Patent Application No. 2005-189508, filed Jun. 29, 2005 is expressly incorporated by reference herein.

What is claimed is:

1. A droplet ejection apparatus, comprising:
    a base;
    a plotting system having a droplet ejection head that ejects functional liquid as a droplet, a carriage that holds the droplet ejection head, and a stage that holds a work at which the droplet is plotted;
    an optical system having a light source that outputs a laser beam and an optical path, which is constituted between the light source and the droplet and through which the laser beam passes to irradiate the droplet; and
    a protection cover that protects the droplet ejection head from the laser beam;
    wherein:
    the plotting system and the optical system are established on the base sharing the upper surface of the base as a reference surface, and pattern is plotted and fixed through cooperation control of both systems;
    the optical path includes a third optical path that is substantially parallel to the stage through which the laser beam is irradiated on the droplet horizontally against the stage;
    a side surface of the protection cover is usable as a plane surface for verification of a laser spot position when adjusting the path of the third optical path; and
    the droplet is irradiated in midair, before contacting the work.

2. The droplet ejection apparatus according to claim 1, wherein the optical path includes a first optical path through which the laser beam is irradiated on the droplet from an upper direction against the stage.

3. The droplet ejection apparatus according to claim 1, wherein the optical path includes a second optical path through which the laser beam is irradiated on the droplet diagonally against the stage.

4. The droplet ejection apparatus according to claim 1, further comprising, on the base, a first electronic camera used to align the work with the plotting system and a second electronic camera used to align the plotting system with the optical system.

5. The droplet ejection apparatus according to claim 1, wherein the positions of the carriage and the droplet ejection head are fixed against the base, and the stage moves so as to carry out the plotting.

6. The droplet ejection apparatus according to claim 1, wherein an area irradiated by the laser that has passed through the optical path is positioned along a moving direction of the work, in front of an area of the work on which the droplet lands.

7. The droplet ejection apparatus according to claim 1, wherein:
    the functional liquid includes a material of an electric, optical, or electrooptical element; and
    a device is manufactured by plotting a predetermined pattern by ejecting the droplet on the work and by irradiating the droplet with the laser beam to fix the pattern.

8. The droplet ejection apparatus according to claim 1, wherein:
    the functional liquid includes conductive particles; and
    a wiring pattern is formed by plotting a predetermined pattern by ejecting the droplet on the work and by irradiating the droplet with the laser beam to dry the droplet and sinter the conductive particles.

9. A droplet ejection apparatus, comprising:
    a base;
    a plotting system having a droplet ejection head that ejects functional liquid as a droplet, a carriage that holds the droplet ejection head, and a stage that holds a work at which the droplet is plotted;
    an optical system having a light source that outputs a laser beam and an optical path, which is constituted between the light source and the droplet and through which the laser beam passes to irradiate the droplet; and
    a first electronic camera on the base used to align the work with the plotting system and a second electronic camera used to align the plotting system with the optical system;
    wherein:
    the plotting system and the optical system are established on the base sharing the upper surface of the base as a reference surface, and pattern is plotted and fixed through cooperation control of both systems.

10. The droplet ejection apparatus according to claim 9, wherein the optical path includes a first optical path through which the laser beam is irradiated on the droplet from an upper direction against the stage.

11. The droplet ejection apparatus according to claim 9, wherein the optical path includes a second optical path through which the laser beam is irradiated on the droplet diagonally against the stage.

12. The droplet ejection apparatus according to claim 9, wherein the optical path includes a third optical path through which the laser beam is irradiated on the droplet horizontally against the stage.

13. The droplet ejection apparatus according to claim 12, further comprising a protection cover that protects the droplet ejection head from the laser beam, the side surface of the protection cover being usable as a plane surface for verification of a laser spot position when adjusting the path of the third optical path.

14. The droplet ejection apparatus according to claim 9, wherein the positions of the carriage and the droplet ejection head are fixed against the base, and the stage moves so as to carry out the plotting.

15. The droplet ejection apparatus according to claim 9, wherein an area irradiated by the laser that has passed through the optical path is positioned along a moving direction of the work, in front of an area of the work on which the droplet lands.

16. The droplet ejection apparatus according to claim 9, wherein:
    the functional liquid includes a material of an electric, optical, or electrooptical element; and
    a device is manufactured by plotting a predetermined pattern by ejecting the droplet on the work and by irradiating the droplet with the laser beam to fix the pattern.

17. The droplet ejection apparatus according to claim 9, wherein:
    the functional liquid includes conductive particles; and
    a wiring pattern is formed by plotting a predetermined pattern by ejecting the droplet on the work and by irradiating the droplet with the laser beam to dry the droplet and sinter the conductive particles.

18. The droplet ejection apparatus according to claim 9, wherein the droplet is irradiated in midair, before contacting the work.

* * * * *